United States Patent
Larsson et al.

(10) Patent No.: US 9,500,685 B2
(45) Date of Patent: Nov. 22, 2016

(54) HANDLING RESONANCES IN A POWER TRANSMISSION SYSTEM

(71) Applicant: ABB RESEARCH LTD, Zürich (CH)

(72) Inventors: Mats Larsson, Baden-Dättwil (CH); Valentin Bürgler, Wil (CH); Priscilla Owen, Basel (CH); Michael Geiger, Ehrendingen (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 14/310,245

(22) Filed: Jun. 20, 2014

(65) Prior Publication Data

US 2014/0303918 A1 Oct. 9, 2014

Related U.S. Application Data

(63) Continuation of application No. PCT/EP2012/075267, filed on Dec. 12, 2012.

(30) Foreign Application Priority Data

Dec. 20, 2011 (EP) .................................... 11194436

(51) Int. Cl.
- *G01R 23/02* (2006.01)
- *H02J 3/24* (2006.01)
- *H02J 3/00* (2006.01)

(52) U.S. Cl.
CPC .................. *G01R 23/02* (2013.01); *H02J 3/24* (2013.01); *H02J 2003/007* (2013.01); *Y02E 60/76* (2013.01); *Y04S 40/22* (2013.01)

(58) Field of Classification Search
CPC .................... H02J 3/24; H02J 2003/007; Y04S 40/22; G01R 23/02; Y02E 60/76

(Continued)

(56) References Cited

U.S. PATENT DOCUMENTS 6,476,521 B1 * 11/2002 Lof et al. ...................... 307/105
6,931,374 B2 * 8/2005 Attias et al. .................. 704/240

(Continued)

FOREIGN PATENT DOCUMENTS

GB        2245398 A  *  1/1992

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) issued on Jul. 3, 2014, by the International Bureau of WIPO in corresponding International Application No. PCT/EP2012/075267. (11 pages).

(Continued)

*Primary Examiner* — Carol S Tsai
(74) *Attorney, Agent, or Firm* — Taft Stettinius & Hollister LLP (57) ABSTRACT

A method, resonance handling device and computer program product are disclosed for handling resonances in a power transmission system. The resonance handling device can include a resonance frequency determining unit configured to obtain measurements from measurement devices in the power transmission system, apply the measurements in at least one state space model and determine modal resonance frequencies in the system based on the application of the system measurements in the state space model, and an activity determining unit configured to determine the modal activity of at least one of the resonance frequencies.

29 Claims, 3 Drawing Sheets (58) Field of Classification Search
USPC ............ 702/66, 75; 704/240, 256; 345/173, 345/177; 307/105
See application file for complete search history.

(56) References Cited

U.S. PATENT DOCUMENTS

| | | | | |
|---|---|---|---|---|
| 7,454,336 | B2* | 11/2008 | Attias et al. | 704/240 |
| 7,487,087 | B2* | 2/2009 | Attias et al. | 704/240 |
| 7,987,059 | B2* | 7/2011 | Gong et al. | 702/66 |
| 8,368,286 | B2* | 2/2013 | Meyer | 310/318 |
| 9,007,348 | B2* | 4/2015 | Nikolovski | 345/177 |
| 2004/0199386 | A1* | 10/2004 | Attias et al. | 704/240 |
| 2005/0119887 | A1* | 6/2005 | Attias et al. | 704/256 |
| 2010/0090538 | A1* | 4/2010 | Larsen et al. | 307/105 |
| 2012/0200517 | A1* | 8/2012 | Nikolovski | 345/173 |
| 2013/0047209 | A1* | 2/2013 | Satoh et al. | 726/2 |
| 2013/0054809 | A1* | 2/2013 | Urmanov et al. | 709/226 |

OTHER PUBLICATIONS

International Search Report (PCT/ISA/210) mailed on Jul. 2, 2013, by the European Patent Office as the International Searching Authority for International Application No. PCT/EP2012/075267.

Written Opinion (PCT/ISA/237) mailed on Jul. 2, 2013, by the European Patent Office as the International Searching Authority for International Application No. PCT/EP2012/075267.

European Search Report dated Jul. 12, 2012 for European Application No. 11194436.9.

Jaime Quintero et al., An Oscillation Monitoring System for Real-time Detection of Small-Signal Instability in Large Electric Power Systems, IEEE Power Engineering Society General Meeting, Jun. 24-28, 2007, Tampa, Florida, USA, pp. 1-8.

Mats Larsson et al., Monitoring of Inter-Area Oscillations under Ambient Conditions using Subspace Identification, Power & Energy Society General Meeting, Piscataway, NJ, USA, Jul. 26, 2009, pp. 1-6.

Jukka Turunen, et al., Comparison of Three Electromechanical Oscillation Damping Estimation Methods, IEEE Transactions on Power Systems, vol. 26, No. 4, Nov. 2011, pp. 2398-2407.

D.J. Trudnowski et al., Overview of Algorithms for Estimating Swing Modes from Measure Responses, Power & Energy Society General Meeting, Piscataway, NJ, USA, Jul. 26, 2009, pp. 1-8.

H. Bourles et al., Design of Robust Controllers for Damping Interarea Oscillations: Application to the European Power System, IEEE Transactions on Power Systems, vol. 19, No. 2, May 2004.

\* cited by examiner

HANDLING RESONANCES IN A POWER TRANSMISSION SYSTEM

RELATED APPLICATION

This application claims priority as a continuation application under 35 U.S.C. §120 to PCT/EP2012/075267, which was filed as an International Application on Dec. 12, 2012 designating the U.S., and which claims priority to European Application 11194436.9 filed in Europe on Dec. 20, 2011. The entire contents of these applications are hereby incorporated by reference in their entireties.

FIELD

The present disclosure relates to the field of wide area monitoring and control of an electric power transmission system. For example, a method, resonance handling device and computer program product are disclosed for handling resonances in a power transmission system.

BACKGROUND INFORMATION

Electromechanical oscillation is an inherent property of an AC transmission system and cannot be entirely eliminated. In many cases, damping of inter-area electromechanical oscillation sets limits for power transfer capacity. In addition, the oscillations may pose a serious threat to system security if they are not controlled properly. From an operational point of view, it is of high priority to be able to estimate the damping of the oscillations reliably in real-time in order to take appropriate and timely measures to keep the system stable.

ABB has a first generation of the electromechanical oscillation detection software implemented in a system named PSGuard. In PSGuard there is a function Power Oscillation Monitoring (POM) used for the detection of power swings in a high voltage power system. The POM function processes a single input signal from Phasor Measurement Units (PMU) and detects various power swing modes, which can be used to detect disturbances.

POM can quickly detect activity of swing modes that are observable in a measurement from for example, a Wide-Area Measurement System (WAMS). Additionally POM indicates the frequency of an oscillation, which may then be compared with existing known modes of the power system e.g., the operator may distinguish if a local or inter-area mode is excited.

The PSGuard system nowadays also has a further function, Power Damping Monitoring (PDM), which uses a similar approach as the POM with the difference that multiple measurements from different locations can be used simultaneously and in general longer time windows of data. PDM is a complement to POM in the sense that the POM can faster detect oscillations arising from disturbances or switching events in the power system, whereas the PDM can better estimate the damping level during normal operating conditions.

PDM is based on the applying of measurement values from a number of PMUs in a model of the system in order to determine system resonances.

One type of function similar to PDM is a so-called Prony analysis, which is described in U.S. Pat. No. 7,987,059. Here measurements are applied in a first and a second state space model in order to obtain resonance frequencies of the system, where the second model is a modally transformed variation of the first state space model.

The use of Prony analysis is also discussed by Jaime Quintero et al in "An Oscillation Monitoring System for Real-time Detection of Small-Signal Instability in Large Electric Power Systems", 2007 IEEE Power Engineering Society General Meeting, Jun. 24-28 2007, Tampa, Fla., USA.

It is thus possible to find out what resonance frequencies there are in the system. However, there is room for improvement in the field of power oscillations damping, especially concerning how serious these resonances are in relation to system stability.

It would therefore be desirable for an improvement on this situation.

SUMMARY

A method is disclosed for handling resonances in a power transmission system, the method comprising: obtaining system measurements ($y_1$, $y_2$, $y_r$) from measurement devices in the power transmission system; applying the measurements in at least one state space model (M1, M2) of the system; determining modal resonance frequencies ($\omega j$) in the system based on application of the system measurements in said state space model; and determining modal activity of at least one of the resonance frequencies.

A resonance handling device is also disclosed for handling resonance modes in a power transmission system, the device comprising: a resonance frequency determining unit configured to obtain measurements ($y_1$, $y_2$, $y_r$) from measurement devices of the power transmission system, to apply the measurements in at least one state space model (M1, M2), and to determine modal resonance frequencies ($\omega_j$) of the system based on application of the measurements in said state space model; and an activity determining unit configured to determine a modal activity of at least one of the resonance frequencies.

A computer program is also disclosed for handling resonance modes in a power transmission system, the computer program being loadable into an internal memory of a computer and comprising computer program code means to cause the computer, when said program is loaded in said internal memory and executed, to perform a method to: obtain system measurements ($y_1$, $y_2$, $y_r$) from measurement devices in the power transmission system; apply the measurements in at least one state space model (M1, M2) of the system; determine modal resonance frequencies ($\omega_j$) in the system based on application of the system measurements in said state space model; and determine modal activity of at least one of the resonance frequencies.

BRIEF DESCRIPTION OF THE DRAWINGS

The subject matter disclosed herein will be explained in more detail in the following text with reference to preferred exemplary embodiments which are illustrated in the attached drawings, of which.

DETAILED DESCRIPTION

The present disclosure sets forth exemplary embodiments which can improve damping in a power transmission system.

According to a first exemplary aspect, a method is provided for handling resonances in a power transmission system, the method including obtaining system measurements from measurement devices in the power transmission system; applying the measurements in at least one state space model of the system; determining modal resonance frequencies in the system based on the application of the system measurements in said state space model; and determining the modal activity of at least one of the resonance frequencies.

According to a second exemplary aspect, a resonance handling device is provided for handling resonance modes in a power transmission system, the device including a resonance frequency determining unit configured to obtain measurements from measurement devices in the power transmission system, apply the measurements in at least one state space model and determine modal resonance frequencies in the system based on the application of the system measurements in said state space model; and an activity determining unit configured to determine the modal activity of at least one of the resonance frequencies.

According to a third exemplary aspect, there is provided a computer program for for handling resonance modes in a power transmission system, the computer program being loadable into an internal memory of a computer and including computer program code means to make the computer, when the program is loaded in the internal memory; obtain system measurements from measurement devices in the power transmission system; apply the measurements in at least one state space model of the system; determine modal resonance frequencies in the system based on the application of the system measurements in said state space model; and determine the modal activity of at least one of the resonance frequencies.

The aspects disclosed herein can have the advantage of providing additional data, in the form activity relating to the resonance frequencies of a power transmission system. This can allow better decisions to be made of which resonance frequencies should be dampened.

In an exemplary variation, the modal activity of a resonance frequency can be determined based on a set of time values of a system model variable linked to the corresponding resonance frequency.

There may furthermore be a first and a second state space model, where the second state space model is a modally transformed variation of the first state space model.

In another exemplary variation, the determining of the modal activity can include estimating the initial state of the system in the first state space model, simulating a time series of the state in the first or the second state space model and determining the modal activity through processing time variations of the state corresponding to the resonance frequency in the second state space model. The simulation may be performed in the first state space model and the simulated states transformed to corresponding states in the second state space model. Alternatively the initial state may be transformed to an initial state in the second state space model and the simulating performed in the second state space model.

In another exemplary variation, the modal activity can be determined based on processing of measurement values through shifting the phase of a measurement value obtained at a point in time with a phase depending on the resonance frequency and the time and combining such phase shifted measurement values in the time interval and relating to the different measurement locations in order to obtain a value of the activity.

In another exemplary variation, there is a ranking performed of the resonance frequencies according to a ranking scheme, which ranking may be performed by a ranking unit of the resonance handling device.

The measurements may furthermore include frequency measurements. Frequency data may be provided in voltage angle or power flow or voltage measurements.

According to another exemplary variation, a method as disclosed can include determining at each sampling instant an average frequency of the measurements for the different sources, obtaining oscillatory components for each source and sampling instant through subtracting the average frequency from the frequency measurement and providing the oscillatory components for determining resonance frequencies and modal activities.

The method may furthermore include using data of a determined modal resonance frequency and data about the modal activity of this resonance frequency to compute a correction signal or configuration parameters of a power oscillation damping device with the objective of reducing the activity or improving the damping in the determined modal resonance The resonance handling device may include a pre-processing unit for performing the above-mentioned pre-processing.

The resonance handling device may further include a probing signal generating unit configured to inject a probing signal into the power transmission system to assist the detection of the resonances.

Figure 1:
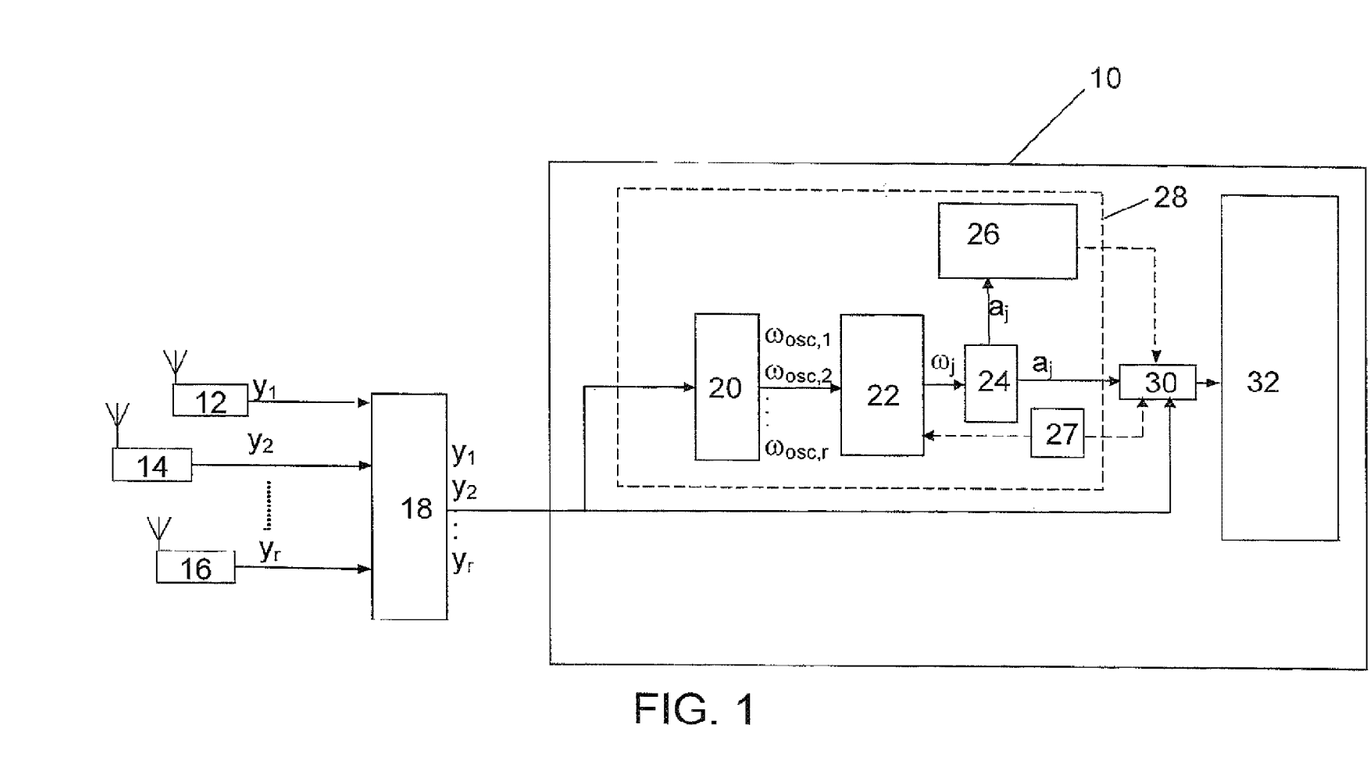
FIG. 1 schematically shows a number of measurement providing devices in an exemplary power transmission system connected via a measurement aligning device to an exemplary power control arrangement.

FIG. 1 schematically shows an exemplary power control arrangement 10 connected to a number of measurement devices 12, 14, 16 in a power transmission system. The power transmission system is for example an AC power transmission system which can be operated at a network frequency such as 50 or 60 Hz.

The power transmission system may be provided in a number of geographical areas. These areas are for example provided on great distances from each other, where one may as an example be provided in the south of Finland and another in the south of Norway. A geographical area can be considered as a coherent area. A coherent area is an area where a group of electrical machines, such as synchronous generators, are moving coherently, (e.g., they are oscillating together). Such an area may also be considered as an electrical area, because the machines are close to each other in an electrical sense. In these geographical areas there are high-voltage tie lines for connecting geographically separated regions, medium-voltage lines, substations for transforming voltages and switching connections between lines as well as various buses in the local areas. Measurement devices are furthermore connected to such power lines and buses. The measurement devices may here be connected to measurement providing devices 12, 14 and 16 that may be Phasor Measurement Units (PMU). A PMU provides time-stamped local data about the system, such as currents and voltage phasors as well as frequency measurements. Frequency data may be present in voltage angle or power flow or voltage measurements from other sources than PMUs. A plurality of measurements collected throughout the network by PMUs and processed centrally can therefore provide a snapshot of the overall electrical state of the power transmission system.

Such PMUs can also be equipped with GPS clocks that synchronize themselves with reference clock devices in the form of GPS satellites and will send measurement values, at equidistant points in time (e.g., every 20 ms). These measurements include measurement values of phasors that are time stamped, and a time stamp may represent the point in time when the phasor was measured in the system.

In FIG. 1 there are generally "r" such measurement providing devices 12, 14 and 16 each providing measurements, where three measurements $y_1, y_2, \ldots y_r$ are shown. These measurement providing devices 12, 14 and 16 are in this example all PMUs that are in contact with a time generating device such as a GPS satellite. They furthermore can measure network properties such as voltages, currents and frequencies, time stamps the measurements and sends these in order for these measurements to be processed by the power control arrangement 10. It should here be realized that there may be many more different measurement providing devices in the system in different geographical areas, where a geographical area normally corresponds to a separate group of machines swinging against a group of machines of another geographical area.

In FIG. 1 a first exemplary measurement providing device 12 is shown as sending a first measurement $y_1$, a second measurement providing device 14 is shown as sending a second measurement $y_2$ and an $r^{th}$ measurement providing device 16 is shown as sending an $r^{th}$ measurement $y_r$. All these measurements are measured on-line and provided for the power control arrangement 10. The measurements $y_1, y_2, \ldots y_r$ are thus obtained at distant geographical locations and may be time stamped by the measurement providing devices 12, 14 and 16, normally using a GPS clock, and sent via communication channels, which are potentially several thousand kilometers in length, to a measurement aligning device 18.

The measurement aligning device 18 may be a Phasor Data Concentrator (PDC), and can receive the above-described measurements and synchronize them (e.g., packages the phasors with the same time stamp).

A measurement aligning device 18 can listen to measurement providing devices that are sending time stamped measurements on a regular basis (e.g., every 20 ms). The measurement aligning device 18 can align the measurements according to the time stamp, expecting one measurement from each measurement providing device per time slot, and can forward all measurements when those which corresponding to a given time slot are available.

The measurement aligning device 18 can provide the time aligned measurements to the power control arrangement 10. It should be realized that the measurement aligning device 18 is not central to the embodiment disclosed; it is thus is optional and may be omitted.

The measurements $y_1, y_2, \ldots y_r$ are for example, more particularly provided to a power oscillations damping device 30 as well as to a resonance handling device 28, both provided within the arrangement 10. The power oscillations damping device may be a wide area power oscillations damping device.

The exemplary resonance handling device 28 can include an optional pre-processing unit 20, which preprocesses the measurements $y_1, y_2, \ldots y_r$ and provide pre-processed data $\omega_{osc,1}, \omega_{osc,2}, \omega_{osc,r}$ to a resonance frequency determining unit 22, which determines resonance frequencies $\omega_1, \omega_2, \omega_j$ of the system. The modal resonance frequency determining unit 22 can be connected to an activity determining unit 24, which determines activities in the resonance frequencies. The activity determining unit 24 is in turn connected to an optional ranking unit 26, which ranks the resonances. The activity determining unit 24 as well as the optional ranking unit 26 are connected to the power oscillations damping device 30 that generates a control signal for instance a wide area control signal. The resonance handling device 28 also can include an optional probing signal generating unit 27 connected to the power oscillation damping device 30 and the resonance frequency determining unit 22. The power oscillation damping device 30 may generate a modulation signal based on one or more frequencies, such as frequencies being activated or excited, and provide this modulation signal or control signal to an actuator control device 32, which in turn is connected to an actuator in the power transmission system (e.g., an element involved in the control of the power transmission system in which the measurement devices 12, 14 and, 16 are provided). The actuator may as an example be a transformer in a FACTS system or a voltage source converter in an HVDC system. When the power oscillations damping device 30 is active (e.g., is acting on measurements of the system), it can provide a feedback loop for closed-loop power oscillation damping (POD), which is the same as damping of electromechanical oscillations caused by the above-mentioned swinging. The power oscillations damping device 30 thus provides a modulation signal to the actuator control device 32, which in turn adds this modulation signal to an actuator control signal in order to counteract power oscillations. The actuator control signal is then provided to the above-mentioned actuator in the power transmission system.

Here it should also be realized that the resonance mode handling device 28 does not need to be provided in the arrangement 10, but may be provided separately for only providing resonance data to be used for analysing resonance modes and activities. It can therefore be seen that exemplary embodiments can be implemented without relying on the wide area power oscillations damping device 30 and the actuator control device 32.

As can be seen in FIG. 1, the resonance handling device 28 receives measurements from the system. In the following, these measurements are described as being collected or received directly from the system. However, it is as an alternative possible that measurements from the system, for instance received from the measurement aligning device 18 are stored in a data storing element associated with the resonance handling device 28. It should here also be realized that both the power oscillations damping device 30 and the optional probing signal generating unit 27 may provide control signals and probing signals to several actuating control units controlling other actuators in the power transmission system.

Figure 2:
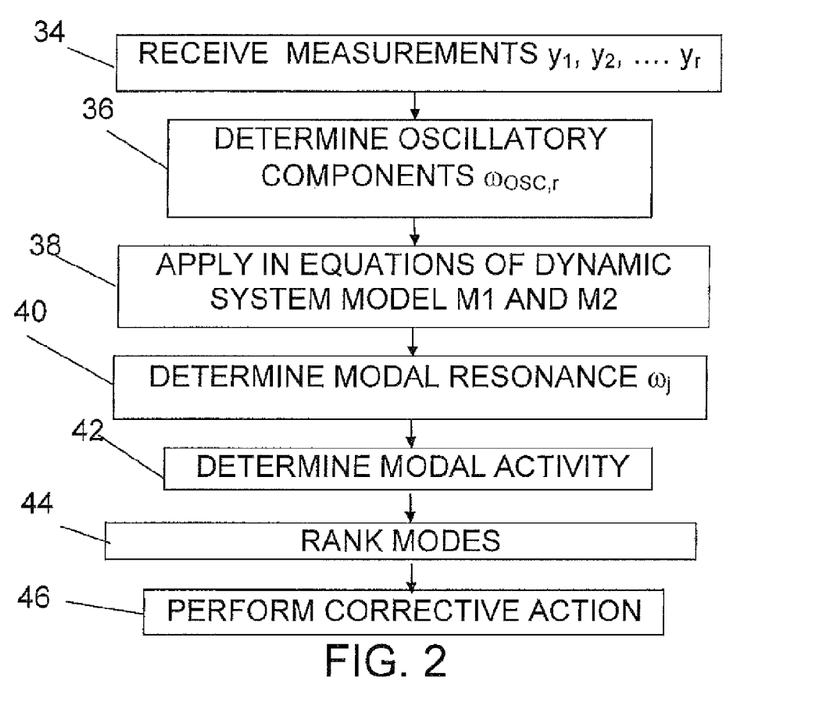
FIG. 2 schematically shows an exemplary flow chart outlining a number of method steps performed in an exemplary method for handling resonances.

The general operation of the resonance mode handling device 28 will now be described with reference to FIG. 2, which shows an exemplary flow chart of a number of method steps in a method for handling resonance.

If the transfer of power (e.g., between two areas) is limited by inadequate damping of oscillations of a group of machines in relation to another group, the resonance handling device 28 can assist in maximizing the power transfer by providing a faster and more accurate view of the current situation than what can be obtained via off-line dynamic simulations. This is due to the fact that the PMU measurements are not subject to modelling errors that are potentially present in off-line simulation models.

The resonance handling device 28 also makes it possible to identify which parts of the system participate in a detected oscillation through providing modal observability information. Such information can be used to identify the root cause of the problem.

It is thus desirable to find out if any resonance frequencies exist in a power transmission system. However, in order to be able to determine a proper corrective activity, this may not be all. There may also be a need for determining the activity of a resonance frequency for instance in order to perform tuning of a power oscillations damping device.

Tuning may be desired because a power transmission system is not a fixed entity. It changes over time. This means that power oscillations damping devices having efficient performance for a particular operating condition may be less effective in a new operating condition. In order to change the damping devices for contributing to system stability when there is a new operating condition, they may need to be tuned. A new operating condition can involve a change in power generation and/or a change in load (nature and pattern). However, it may also involve a change in network configuration.

The present disclosure also allows activities such as tuning to be made more efficiently based on more information than the existence of a resonance. Exemplary embodiments can determine which can the activity of resonance frequencies having been identified in a power transmission system. The information about resonance frequencies and their activities can then be used for corrective actions such as tuning of power oscillations damping devices. Such tuning will now mainly be described in relation to wide area power oscillations damping. It should however be realized that it may also be used in relation to local power oscillations damping. It may also be used in providing information to an operator, which may in turn determines desired actions.

The determination of resonance frequencies and their activities may be initiated or started through manual activation, for instance through an operator pushing a button. An operator may also perform further selections, such as which measurements to use as input, the length of a sliding window in which measurements are to be taken and how often the resonance handling device is to be activated and produce an output. It is for instance possible that the measurements include voltage angle difference measurements and frequency measurements, that the sliding window is, for example, around 10-15 min long and that the resonance handling device is to be activated or automatically executed and produce an output for example, once every 10-30 seconds. It is also possible to decide the maximum number of resonance modes to detect and strategy for sorting of the output signals. The different strategies may include ranking by lowest damping, proximity to certain predefined frequencies, or sorting by absolute frequency.

Operation may also be initiated or started automatically, like at recurring intervals or based on the detection of system measurement discrepancies. As the method is initiated, the power transmission system with power oscillation damping devices may furthermore be in operation. The system may thus be in the process of delivering electrical power and the power oscillation damping devices be in the process of detecting and damping oscillations.

A probing signal is generated and injected into the power transmission system by the earlier mentioned probing signal generating unit 27 in order to assist the detection of resonances. Such a signal could be a probing signal that is recurring. It may be furthermore be provided as a pulse train having a pulse repetition frequency set to correspond to the frequencies expected at inter area mode oscillations. A probing signal can have an advantage that a more accurate determination of resonance mode frequencies and damping can be achieved than without. This in order to be able to excite the frequencies at which inter area modes of oscillation may occur. These oscillations can, for example, occur at frequencies at or below 1 Hz for systems operating at frequencies of 50-60 Hz. Therefore such pulse repetition frequency may with advantage be set at for example, about 1 Hz, which is at or slightly above the frequencies to be excited. This train may thus include pulses for instance provided during a pre-determined probing signal window associated with the previously described sliding window in which measurements are obtained. The probing signal may also include white noise.

The probing signal may furthermore be provided from the probing signal generating unit 27 to the actuator control device 32, which would modulate the probing signal onto a control signal used to control the actuator. In this way a probing signal may be sent into the power transmission system. A probing signal may thus be sent from the same position in the power transmission system from where power oscillation damping control is performed by the power oscillations damping device 30. The purpose of providing a probing signal is to use it as an input signal used in state space models. As an alternative to a probing signal it is possible that the control signals of a power oscillation damping device is used as such an input signal. Since such control signals can be rarely used, it is possible that there is no input signal.

An exemplary method can involve the resonance handling device 28 obtaining system measurements from measurement devices placed at various location in the power transmission system. This can, for example, involve the pre-processing unit 20 of the resonance handling device 28 receiving measurements $y_1, y_2, \ldots y_r$ from the measurement devices 12, 14 and 16, step 34, which measurement devices thus are those used when performing power oscillations damping. These measurement devices are thus a part of the system framework used for power oscillation damping. The measurements may here include phasors, voltage and/or current phasors (e.g., with information about amplitude and phase, perhaps in the form of phase angle differences, as well as frequency). The measurements may furthermore be obtained in the previously described sliding window.

In the pre-processing unit 20 an oscillatory component $\omega_{osc,1}, \omega_{osc,2}, \omega_{osc,r}$ of each measurement $y_1, y_2, \ldots y_r$ is determined, step 36. The oscillatory component $\omega osc_{osc,r}$ is the frequency deviation of the specific measurement from the average frequency of all the measurements. How such an oscillatory component may be obtained will be described in more detail later. The pre-processed measurements are then forwarded to the resonance frequency determining unit 22. If a probing signal is used, the resonance frequency determining unit 22 would also receive the probing signal. The resonance frequency determining unit 22 then goes on and applies the measurements in at least one state space model of the system. This can involve the resonance frequency determining unit 22 applying the pre-processed measurements in the equations of a first and a second dynamic state space system model M1 and M2, step 38, where the second system model M2 is a modally transformed variation of the first system model M1. The second system model M2 is for example, a system model where a matrix of eigenvectors of one parameter in the first model is used for the transformation.

More particularly, an exemplary method is based on a general state space description of the power system dynamics in the first model M1 in the so-called innovation form:

$$x(k+1)=Ax(k)+Bu(k)+Ke(k)$$

$$y(k)=Cx(k)+Du(k) \quad (1)$$

where the system matrices A, B, C, and D in the first model M1 include parameters describing the system dynamics and the matrix K includes parameters describing a way the noise affects the system. The vectors x(k) and y(k) denote an estimated internal state and the measured outputs of the model, at time instant k. The number of samples in the data sequences used for identification is denoted N and the order of the identified model n. The vector u(k) can be used to model the external probing signal inputs that are applied to assist the identification of the system dynamics. The system identification problem related to the form in equation (1) can include finding estimates of the system order and the system matrices. The discrete-time innovation form model can be converted to a corresponding continuous-time and then transformed using a modal decomposition yielding the second model M2:

$$\zeta(k+1)=\Lambda\zeta(k)+\Phi^{-1}u(k)$$

$$y(k)=C\Phi\zeta(k)+Du(k) \quad (2)$$

This modal transformation $\zeta_k=\Phi^{-1}x_k(k)$ where $\Phi$ denotes the right eigenvectors of the matrix A decouples the modes from each other and the properties of each mode can be determined from the system matrix element $\Lambda=\text{diag}(\lambda_1 \ldots \lambda_n)$. From the eigenvalue $\Lambda=a_j+i\omega_j$, related to mode j, the corresponding modal frequency $\omega_j$ is evident and its damping ratio $\zeta_j$ can easily be calculated. It can thus be seen that the modal resonance frequencies $\omega_j$ are determined based on the application of the system measurements in the state space model M2, step 40.

Furthermore, the modal observability matrix can be given by:

$$O=C\Phi \quad (3)$$

whose elements O(r, j) describe how the mode "j" is observable from the output "r". The magnitude of the complex elements shows how observable a modal activity is in a particular output and the complex argument the phase of that activity. Mode shape analysis can be used to distinguish local modes from inter-area modes, and to identify which parts of the system swing in a coherent way.

When the modal resonances have been determined, the activity determining unit 24 then continues and determines the modal activity of at least one resonance frequency. It thus determines the activity of the resonance modes, step 42. This is for example, done based on a set of time values of with a model variable linked to the resonance frequency being investigated. The model variable used may be a variable in the first model M1 but can, for example, be a variable in the second model M2. The modal activity may include processing such time values of the model variable, which processing may include summing. The time values of the model variable may also be processed, such as phase shifted or modally transformed.

The modal decomposition given by equation (3) may contain a rather large number of modes of which only a few may be of interest to a power system operator. This means that it may be desirable to perform a ranking in order to find out most relevant modes.

Therefore after the activity has been determined, the ranking unit 26 can rank the resonances according to a ranking scheme, step 44, The ranking may be made according to any of the following exemplary three selection schemes:

1. Damping level
2. Proximity to certain number K a-priori selected desired frequencies, and
3. Modal activity For selection based on damping, a list of all modes may be created. The list may then be sorted according to increasing frequency and the first modes in the sorted list may be selected.

For selection based on frequency, the mode list can be sorted K times according to the proximity to each of the desired frequencies. In each iteration this mode is moved to a selected mode list.

For selection based on damping, the list may be sorted according to increasing magnitude of activity, for instance as determined according of equations (7) or (8) described in more detail below, and a number of modes appearing first in the sorted list are selected.

It may here also be mentioned that it is also possible to use a combination of any or all of three of schemes.

The resonance and activity data can be used for performing a corrective action, step 46, such as tuning the power oscillations damping device 30. The data of a determined modal resonance frequency and data about the modal activity of this resonance frequency may thus be used to compute a correction signal or configuration parameters of the power oscillation damping device (30) with the objective of reducing the activity or improving the damping in the determined modal resonance.

If the activity is tuning, it is possible to tune power oscillation damping devices for more efficient damping of inter area modes of oscillation. This can be done without any knowledge of the real or actual system parameters. The tuning may be started through a detected tuning start condition. This condition may be an operator selecting to start a tuning. The condition may also be a time condition; such as a certain time that has elapsed since the last tuning. Tuning may thus be performed recurrently in the system at given time periods. Another possible tuning start condition is that the above-mentioned system parameters have changed too much. Another condition may be a known system change. It is possible to compare measurements made by the measurement providing devices with predicted measurement values for a given probing pulse and perform a re-tuning if the difference between them is above a difference threshold. It is furthermore also possible that this comparison of the difference is combined with the time based tuning in that the comparison is only made at specific recurring times.

The above given description is a description of an exemplary general operation for handling resonance in the resonance handling device 28. A more detailed description of some of the aspects that are particular to exemplary embodiments will be provided. One of these aspects is the pre-processing performed in the pre-processing unit 20 which will be described with reference also being made to FIG. 3.

Figure 3:
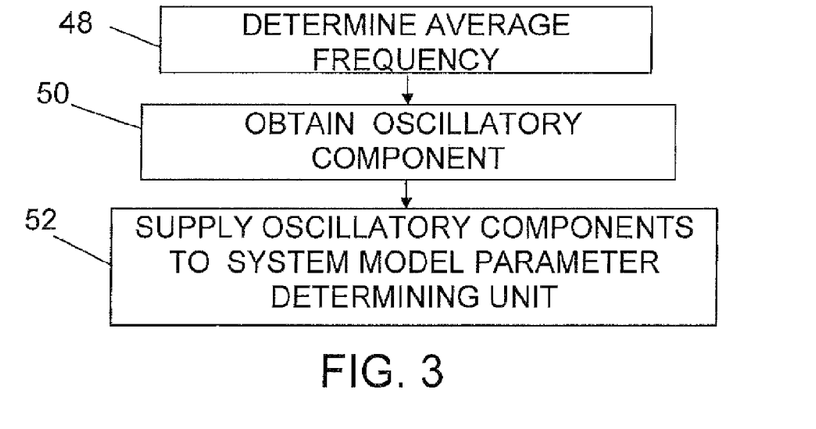
FIG. 3 schematically shows a number of exemplary steps for pre-processing measurements obtained from the system.

Pre-processing of the measurements supports the determination of resonance frequencies and activity. This pre-processing can have an advantage of isolating the oscillations of interest from the rigid-body motion of all the frequencies as follows.

The frequency recorded by a PMU 12, 14 or 16 at any particular grid location at every time sample k can include a component corresponding to the coherent movement of all the generators in the $\omega_{avg}(k)$ and an oscillatory component $\omega_{osc,r}(k)$ containing the oscillations that are to be determined. A frequency measurement obtained by a PMU may thus be expressed as:

$$\omega_{meas,r}(k)=\omega_{avg}(k)+\omega_{osc,r}(k) \quad (4)$$

The pre-processing unit 20 therefore determines the average frequencies $\omega_{avg}(k)$, step 48, which may be done through estimating the average frequency at every time instant k as the average value of the frequency measurements from all N locations:

$$\hat{\omega}_{avg}(k) = \frac{1}{N}\sum_{r=1...N}\omega_{meas,r}(k) \quad (5)$$

Thereafter the pre-processing unit 20 can obtain the oscillatory component, step 50. The oscillatory component of the frequency measurements $\hat{\omega}_{osc,r}(k)$ are isolated by subtracting the estimated average frequency from the frequency measurements:

$$\hat{\omega}_{osc,r}(k)=\omega_{meas,r}(k)-\hat{\omega}_{avg}(k) \quad (6)$$

The estimated oscillatory part in each measurement $\hat{\omega}_{osc,r}(k)$ can be used in the determining of modal resonance and modal activity being performed by the resonance frequency determining unit 22 and activity determining unit 24.

An exemplary advantage of the proposed pre-processing is that it does not introduce any time delay since only measurements from a single time instant can be used. It does furthermore not corrupt the oscillatory component through filtering. This is much more effective than the standard practice in system identification such as, for instance, eliminating trend by subtracting the time average, or through high- or bandpass filtering of the measurement. An example on the standard practice can be found at http://www.amazon.com/System-Identification-Theory-User-2nd/dp/0136566952.

The determining of resonance modes present in the system based on the system models M1 and M2 as described above herein can be useful for determining which oscillatory modes could be dangerous if they are excited, but does not provide any information about whether the modes are actually excited or not (e.g., if they have any activity or not).

The determining of modal activity may be performed according to two different exemplary embodiments.

Figure 4:
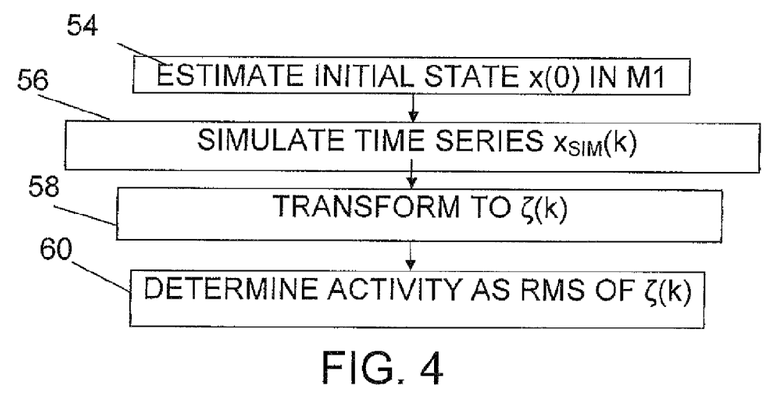
FIG. 4 schematically shows a number of exemplary method steps for determining activity of a resonance frequency according to a first exemplary embodiment.

The determining of modal activity according to a first exemplary embodiment will now be described with reference to FIG. 4, which shows a number of method steps being performed in the activity determining unit 24.

In the first exemplary embodiment, the activity determination here starts with estimating the initial state x(0) of the system in the first system model M1 that would best reproduce the time series of the measurements used to make the identification, step 54. This initial state may easily be estimated using parameters of the vectors of the equations in the first model M1.

Based on this initial state estimate, the system model can be simulated, resulting in a simulated time series $x_{sim}(0)$ of the state in the first model M1, step 56. This time series can be transformed to modal coordinates through the transformation $\zeta(k)=\Phi^{-1}x_{sim}(k)$, step 58. The activity $a_j$ in each mode j can then be directly assessed from processing of the time variations of $\zeta(k)$, step 60, for example using a root mean square:

$$a_j = \sqrt{\frac{1}{N}\sum_{1...N}\zeta_j(k)^2} \quad (7)$$

where N denotes the number of samples in the simulated time series. For a faster response it is also possible to use only a part of the time series to compute the modal activity. It can thus be seen that the activity in this way is obtained based on a set of time values k associated with a model variable, here $\zeta$, the transformed state x, linked to the investigated resonance frequency $\omega_j$. Here it is also possible to use another type time variation determination such as a least squares determination.

In an exemplary variation of this first embodiment, the initial state x(0) can be first transformed to modal coordinates using $\zeta(0)=\Phi^{-1}x_{sim}(0)$ followed by simulating the estimated system in theses modal coordinates of the second model M2 and assessing the modal activity by using equation (7). This variation can be computationally more effective than the first.

According to a second exemplary embodiment, the activity may be determined based on the frequency decomposition of the measurement sequence.

Figure 5:
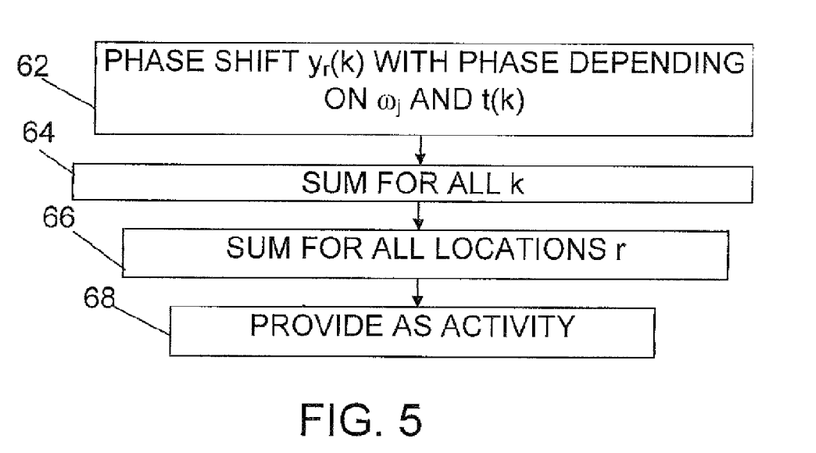
FIG. 5 schematically shows a number of exemplary method steps for determining activity of a resonance frequency according to a second exemplary.

This second embodiment will now be described with reference being made to FIG. 5, which shows a number of alternative method steps being performed by the activity determining unit 24.

When determining the resonances of the system, the oscillatory behaviour can be described by "n" modal variables corresponding to frequencies $\omega_j$, respectively. The modal activity in each mode "j" can then be computed using the measured output time series y(k) through:

$$a_j = \sum_{i=1...M}\sum_{k=1...N} y_i(k)e^{j\omega_j t(k)} \quad (7)$$

where M is the number of measurements series used and N the number of samples in each measurement series.

It can here be seen that the measurements $y_i$ obtained at various points in time within a sliding window from a certain location or PMU can be shifted with a phase that depends on the resonance frequency $\omega_j$ and the time of the measurement, step 62. The phase shifted measurements in the time interval of the sliding window and relating to different measurement locations are then combined for obtaining a value of the activity. The phase shifted measurements of a location for the sliding window (e.g., for all values k), are more particularly being summed, step 64. Such a sum can be provided for all locations and the sums of all locations can be summed up, step 66, in order to provide the activity $a_j$ of the frequency, step 68.

It can also here be seen that the activity in this way can be obtained based on a set of time values k associated with a model variable, here the actual measurements "y", related to the resonance frequency $\omega_j$ being investigated. The determination of activity according to the exemplary second embodiment has furthermore proved to be very reliable.

For both embodiments, the activity can be a complex quantity whose absolute value denotes the amount of activity in a particular mode and whose argument corresponds to the relative phase with which the activity can be seen in each measurement.

A resonance handling device as disclosed herein can be used in a number of different contexts. It can for instance be used in a Wide-area Measurement System (WAMS) such as PSGuard. It can also be used in a Network Management system such as ABB Network Manager. It is also possible to use it in a standalone project, in a protection relay, in a remote terminal unit (RTU) with phasor data collection capabilities, in a Flexible Alternating Current Transmission System (FACTS) or High Voltage Direct Current (HVDC) control system such as MACH2 or in a generator excitation system controller such as UNITROL6000

It should here also be mentioned that it is possible to omit the pre-processing unit, probing signal generating unit as well as the ranking unit from the resonance determining device. These are thus optional. The resonance frequency determining unit and activity determining unit can be provided in any combination with these units.

A resonance handling device as disclosed herein, as well as the arrangement in which it is provided, may, for example be advantageously provided in the form of one or more processors together with an internal memory including computer program code, which when being operated on by the processor performs the above mentioned power control device functionality. It will thus be apparent to those skilled in the art that a resonance handling device as disclosed herein may be hardwired, such as provided in the form of discrete components providing the functional blocks depicted in FIG. 1 or implemented as a computer program or any combination thereof. Such a computer program may also be provided on a computer program product, such as one or more data carriers, such as memory sticks or CD ROM disks, carrying the herein mentioned computer program code.

It should be realized that the present invention can be varied in a multitude of ways apart from those described herein. Therefore the present invention is only to be limited by the following claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method for handling resonances in a resonance handling device of a power transmission system, the method comprising:
   in the resonance handling device:
      obtaining system measurements from measurement devices in the power transmission system;
      applying the measurements in at least one state space model of the system;
      determining modal resonance frequencies in the system based on application of the system measurements in said state space model;
      determining modal activity of at least one of the resonance frequencies; and
      outputting a control signal for counteracting power oscillations to the power transmission system based on the determined modal activity of at least one of the resonance frequencies.

2. The method according to claim 1, wherein determining the modal activity of a resonance frequency is based on a set of time values of a system model variable linked to a corresponding resonance frequency.

3. The method according to claim 1, wherein there are first and second state space models, where the second state space model is a modally transformed variation of the first state space model, the determining of the modal activity comprising:
   estimating an initial state of the system in the first state space model;
   simulating a time series of the state in the first or the second state space model; and
   determining the modal activity through processing time variations of the state corresponding to the resonance frequency in the second state space model.

4. The method according to claim 3, wherein the simulating is performed in the first state space model, the method comprising:
   transforming the simulated states to corresponding states in the second state space model.

5. The method according to claim 3, comprising:
   transforming the initial state to an initial state in the second state space model; and
   performing the simulating in the second state space model.

6. The method according to claim 1, wherein determining the modal activity comprises:
   processing measurement values through shifting a phase of a measurement value obtained at a point in time with a phase depending on a resonance frequency and time; and
   combining such phase shifted measurement values in the time interval and relating to different measurement locations to obtain a value of the activity.

7. The method according to claim 1, comprising:
   ranking the resonance frequencies according to a ranking scheme.

8. The method according to claim 1, wherein the measurements include frequency measurements, and the method comprises:
   determining at each sampling instant an average frequency of the measurements for different sources;
   obtaining oscillatory components for each source and sampling instant by subtracting the average frequency from the frequency measurement; and
   providing oscillatory components for determining resonance frequencies and modal activities.

9. The method according to claim 1, wherein outputting a control signal comprises:
   using data of a determined modal resonance frequency and data about the modal activity of this resonance frequency to compute a correction signal or configuration parameters of a power oscillation damping device for affecting activity or damping in a determined modal resonance.

10. A resonance handling device for handling resonance modes in a power transmission system, the device comprising:
   a resonance frequency determining unit configured to obtain measurements from measurement devices of the power transmission system, to apply the measurements in at least one state space model, and to determine modal resonance frequencies ($\omega_j$) of the system based on application of the measurements in said state space model; and an activity determining unit configured to determine a modal activity of at least one of the resonance frequencies.

11. The resonance handling device according to claim 10, wherein the activity determining unit is configured to determine the modal activity based on a set of time values of a system model variable linked to a corresponding resonance frequency.

12. The resonance handling device according to claim 10, comprising:

first and second state space models, where the second state space model is a modally transformed variation of the first state space model; and the activity determining unit, when determining the modal activity, is configured to estimate an initial state of the system in the first state space model, simulate a time series of the state in the first or the second state space model, and determine modal activity through processing time variations of the state corresponding to a resonance frequency in the second state space model based on a set of time values of a system model parameter related to a corresponding resonance frequency.

13. The resonance handling device according to claim 12, wherein the simulation is performed in the first state space model, and the activity determining unit is configured to transform simulated states to corresponding states in the second state space model.

14. The resonance handling device according to claim 12, wherein the activity determining unit is configured to transform the initial state to an initial state in the second state space model, and to perform the simulation in the second state space model.

15. The resonance handling device according to claim 10, wherein the activity determining unit is configured to determine modal activity based on processing of measurement values through shifting a phase of a measurement value obtained at a point in time with a phase depending on a resonance frequency and a time, and to combine such phase shifted measurement values in a time interval and to relate to different measurement locations to obtain a value of the activity.

16. The resonance handling device according to claim 10, comprising:

a ranking unit configured to rank resonance frequencies according to a ranking scheme.

17. The resonance handling device according to claim 10, wherein the measurements include frequency measurements, the device comprising:

a pre-processing unit configured to determine, at each sampling instant, an average frequency of measurements for different sources, and obtain oscillatory components for each source and sampling instant by subtracting the average frequency from the frequency measurement to provide oscillatory components for determining resonance frequencies and modal activities.

18. The resonance handling device according to claim 10, comprising:

a probing signal generating unit configured to inject a probing signal into a power transmission system to assist with detection of the resonances.

19. A computer program for handling resonance modes in a power transmission system, the computer program being loaded into an internal memory as computer program code to cause the computer, when said program is loaded in said internal memory and executed, to perform a method to:

obtain system measurements from measurement devices in the power transmission system;

apply the measurements in at least one state space model of the system;

determine modal resonance frequencies in the system based on application of the system measurements in said state space model; and determine modal activity of at least one of the resonance frequencies.

20. The method according to claim 2, wherein there are first and second state space models, where the second state space model is a modally transformed variation of the first state space model, the determining of the modal activity comprising:

estimating an initial state of the system in the first state space model;

simulating a time series of the state in the first or the second state space model; and determining the modal activity through processing time variations of the state corresponding to the resonance frequency in the second state space model.

21. A power transmission system comprising:

measurement devices connected to power lines and buses; and a resonance handling device for handling resonance modes, the resonance handling device including:

a resonance frequency determining unit configured to obtain measurements from the measurement devices of the power transmission system, to apply the measurements in at least one state space model and to determine modal resonance frequencies ($\omega_j$) of the system based on application of the measurements in said state space model; and an activity determining unit configured to determine a modal activity of at least one of the resonance frequencies.

22. The system according to claim 21, wherein the activity determining unit is configured to determine the modal activity based on a set of time values of a system model variable linked to a corresponding resonance frequency.

23. The system according to claim 21, wherein the resonance handling device includes:

first and second state space models, wherein the second state space model is a modally transformed variation of the first state space model; and the activity determining unit, when determining the modal activity, is configured to estimate an initial state of the system in the first state space model, simulate a time series of the state in the first or the second state space model, and determine modal activity through processing time variations of the state corresponding to a resonance frequency in the second state space model based on a set of time values of a system model parameter related to a corresponding resonance frequency.

24. The system according to claim 23, wherein the simulation is performed in the first state space model, and the activity determining unit is configured to transform simulated states to corresponding states in the second state space model.

25. The system according to claim 23, wherein the activity determining unit is configured to transform the initial state to an initial state in the second state space model, and to perform the simulation in the second state space model.

26. The system according to claim 21, wherein the activity determining unit is configured to determine modal activity based on processing of measurement values through shifting a phase of a measurement value obtained at a point in time with a phase depending on a resonance frequency and a time, and to combine such phase shifted measurement values in a time interval and to relate to different measurement locations to obtain a value of the activity.

27. The system according to claim 21, wherein the resonance handling device includes a ranking unit configured to rank resonance frequencies according to a ranking scheme.

28. The system according to claim 21, wherein the measurements include frequency measurements, and the resonance handling device includes:
   a pre-processing unit configured to determine, at each sampling instant, an average frequency of measurements for different sources, and obtain oscillatory components for each source and sampling instant by subtracting the average frequency from the frequency measurement to provide oscillatory components for determining resonance frequencies and modal activities.

29. The system according to claim 21, wherein the resonance handling device includes a probing signal generating unit configured to inject a probing signal into a power transmission system to assist with detection of the resonances.

* * * * *